(12) United States Patent
Ehlers

(10) Patent No.: US 7,703,315 B2
(45) Date of Patent: Apr. 27, 2010

(54) ELECTRICAL SYSTEM TESTING USING A WIRELESS-CONTROLLED LOAD BANK

(75) Inventor: Mark S. Ehlers, Fort Wayne, IN (US)

(73) Assignee: International Truck Intellectual Property Company, LLC, Warrenville, IL (US)

( * ) Notice: Subject to any disclaimer, the term of this patent is extended or adjusted under 35 U.S.C. 154(b) by 197 days.

(21) Appl. No.: 12/057,018

(22) Filed: Mar. 27, 2008

(65) Prior Publication Data
US 2009/0241651 A1    Oct. 1, 2009

(51) Int. Cl.
G01M 15/00    (2006.01)
(52) U.S. Cl. .................................................. 73/114.59
(58) Field of Classification Search ............... 73/114.58, 73/114.59, 114.61, 114.62; 340/439, 455
See application file for complete search history.

(56) References Cited

U.S. PATENT DOCUMENTS

| | | | | |
|---|---|---|---|---|
| 4,738,133 A | * | 4/1988 | Breckel et al. ........... | 73/114.58 |
| 5,003,479 A | * | 3/1991 | Kobayashi et al. ........... | 701/33 |
| 5,056,023 A | * | 10/1991 | Abe ........................... | 701/32 |
| 5,541,840 A | * | 7/1996 | Gurne et al. .................. | 701/33 |
| 5,935,180 A | * | 8/1999 | Fieramosca et al. .......... | 701/29 |
| 5,937,368 A | * | 8/1999 | Hall et al. ................... | 702/123 |
| 6,079,259 A | * | 6/2000 | Starman .................. | 73/114.45 |
| 6,477,478 B1 | | 11/2002 | Jones et al. | |
| 2008/0114501 A1 | * | 5/2008 | Wu .............................. | 701/2 |
| 2009/0192700 A1 | * | 7/2009 | Votoupal et al. ............ | 701/113 |

OTHER PUBLICATIONS

Midtronics, Inc., "InTELLECT EXPHD—Expandable Electrical Diagnostic Platform" Instruction Manual, 168-408A May 2006, www.midtronics.com.

* cited by examiner

Primary Examiner—Eric S McCall
(74) Attorney, Agent, or Firm—Jeffrey P. Calfa; Mark C. Bach

(57) ABSTRACT

A method for testing a circuit of a D.C. electrical system in a motor vehicle that includes connecting a load bank (30) to a D.C. electrical source such as a battery bank (24) or an alternator (26) and wirelessly operating the load bank (36) to set the load that the load bank imposes on the D.C. source during circuit testing.

4 Claims, 3 Drawing Sheets

ELECTRICAL SYSTEM TESTING USING A WIRELESS-CONTROLLED LOAD BANK

FIELD OF THE INVENTION

This invention relates generally to diagnostic testing of motor vehicle electrical systems, particularly diagnostic testing that uses a load bank to test various circuits such as a battery charging circuit.

BACKGROUND OF THE INVENTION

Most motor vehicles have powerplants in which fuel is combusted to generate heat for operating the powerplant. Typical powerplants are internal combustion engines, either spark-ignition (gasoline) or compression-ignition (diesel). A running engine also operates various accessory devices like an alternator, air conditioner compressor, power steering pump, etc.

An alternator generates electricity that supplies the needs of the vehicle electrical system including maintaining state-of-charge of a battery bank that comprises one or more D.C. storage batteries.

Diagnostic testing of the various portions of the electrical system, such as the charging system, may be performed on occasion to assure that they are operating properly and/or to diagnose possible faults in the system, including faulty devices, faulty wiring, and faulty connections. Various diagnostic test devices are commercially available. One such device bears the name "InTELLECT $^{EXP}$HD".

The "InTELLECT $^{EXP}$HD" comprises a handheld unit and various test cables for connecting the handheld unit to various portions of an electrical system to enable a technician to perform various diagnostic tests. The handheld unit comprises an expandable electronic platform for performing various diagnostic test algorithms, including battery/alternator testing.

For performing a diagnostic test and acquiring test result data, the device comprises a keyboard, a display, and various ports and interfaces. The ports provide for connection of various test cables to the handheld unit. The interfaces provide for data transmission to other devices, such as transmission of a test report to a printer.

When the "InTELLECT $^{EXP}$HD" is used to test the battery charging system, one end of an electrical cable that is sometimes called an AMP CLAMP is connected to a mating port of the handheld unit. At the opposite end, the AMP CLAMP comprises an electrical coil that can be clamped around the exterior of one or more wires or cables so that electric current flowing through the wires/cables passes through the interior of the coil. The current creates magnetic flux that passes through the interior of the coil, with the magnitude of the magnetic flux being correlated with the magnitude of the electric current.

A typical charging circuit diagnostic test procedure comprises placing the AMP CLAMP around one or more cables that connect the alternator positive output terminal to the positive terminal of the battery bank and then selectively turning various electrical devices in the vehicle on and off to selectively load and unload the electrical system. The effect of connecting and disconnecting various devices is detected via the AMP CLAMP, with changes in flux caused by changes in current providing data input to the handheld unit. The collected data is then analyzed and evaluated. Battery voltage and alternator voltage are also monitored during the test for analysis in conjunction with current measurements.

The inventor has observed that the use of existing electrical devices in a motor vehicle to load the vehicle's electrical system for the purpose of evaluating the charging system may not assure the best accuracy of such an evaluation. Switching various devices on and off may not provide a range of loading that will enable the full load rating of the alternator to be tested because the alternator, if properly rated for the expected loads that may be imposed on it, is unlikely to be loaded to the full extent of its rating simply by turning various loads in the vehicle on and off.

For performing certain tests such as the battery charging test, it is known to connect a load bank directly across the alternator output. Depending on the particular type of test equipment being used, electrical sensors, such as the AMP CLAMP and/or one or more voltmeters, are used to measure current/voltage parameters of interest during the test. The test typically involves running the engine at different speeds and setting the load bank to different load settings.

Because the battery bank and the alternator are located at various locations in the vehicle that are remote from the occupant compartment, the load bank is also remote from the occupant compartment when connected across either the battery bank or the alternator. Yet many of the various tasks associated with the diagnostic test procedure, such as accelerating the engine, need to be performed from the occupant compartment.

When a diagnostic test procedure requires that the load that is imposed by the load bank on the electrical system be changed at various times during the test, either a test technician who is in the vehicle must get out, change the load, and re-enter the vehicle, or else a second technician must be present to change the load while the first technician remains in the vehicle.

A load bank can be connected to a point in certain electrical circuits in a motor vehicle that is fed from the battery bank through a cable or cables in order to test the integrity of the cable or cables and their connections without the circuit load drawing any current. One example would be testing the feed to the cranking motor of a large diesel truck which has a mag switch. A load bank can also be used to test the feeds to other circuits if the circuit loads are temporarily disconnected from the feeds so as not to interfere with the load bank. The ability to remotely operate the load bank when any vehicle circuit is being tested is a significant advantage in terms of test time, test convenience, and efficient use of test technician personnel.

SUMMARY OF THE INVENTION

The present invention comprises an improved method for diagnostic testing of various portions of a motor vehicle's electrical system such as the battery charging system. One advantage of the invention is that a single technician can perform a diagnostic test of the vehicle's charging system. Another advantage in the case of charging system testing is that the alternator can be loaded over a wider range of loads while a single test technician running the test remains seated in the occupant compartment of the vehicle.

A generic aspect of the present invention relates to a method for testing an electrical system of motor vehicle comprising a powerplant in which fuel is combusted to generate heat for operating the powerplant to enable the powerplant to propel the vehicle and to operate electrical equipment in the electrical system that includes an alternator for generating electricity to maintain a desired state-of-charge of a D.C. battery bank that comprises one or more D.C. batteries.

The method comprises: connecting a test load bank to positive and negative terminals of one of the battery bank and the alternator; connecting a service tool for performing the test to the electrical system; disconnecting all electrical equipment from the battery bank except equipment required for operating the powerplant and maintaining battery bank state-of-charge; operating the powerplant; operating the service tool to perform the test; and during the test, wirelessly operating the load bank to change the load that the battery bank imposes on the one of the battery bank and the alternator.

Another generic aspect of the present invention relates to a method for testing integrity of at least one cable and its connection to a terminal of a D.C. electrical source.

The method comprises: connecting a test load bank to a terminal that, in a vehicle circuit, is connected through the at least one cable to the terminal of the D.C. electrical source; performing a test that comprises measuring one or more electrical parameters of the circuit; and during the test, transmitting a wireless signal from a transmitter to a receiver at the load bank to operate at least one switch in the load bank to change an operational characteristic of the load bank.

The foregoing, along with further features and advantages of the invention, will be seen in the following disclosure of a presently preferred embodiment of the invention depicting the best mode contemplated at this time for carrying out the invention. This specification includes drawings, now briefly described as follows.

DESCRIPTION OF THE PREFERRED EMBODIMENT

Figure 1:
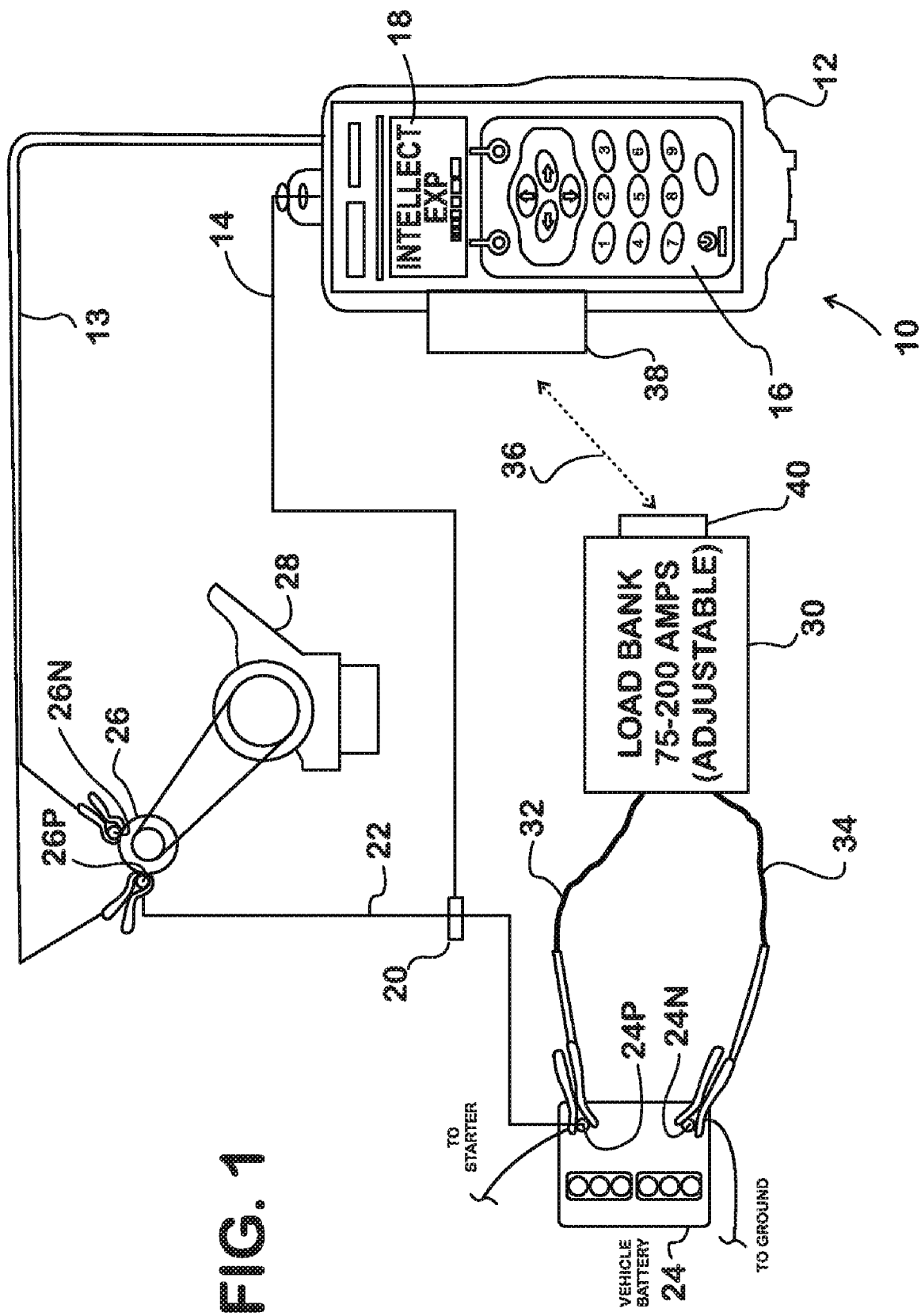
FIG. 1 is a basic schematic diagram showing a diagnostic test device and how it is associated with a vehicle electrical system to test the charging system in accordance with principles of the present invention.

FIG. 1 shows a diagnostic test device 10, the "INTELLECT $^{EXP}$HD" by way of example, for testing the electrical system in a motor vehicle. Device 10 comprises a handheld unit 12 and various test cables for connecting the unit to various portions of the electrical system to enable a technician to perform various diagnostic tests. Unit 12 has two ports, one of which provides for connection of a battery test cable 13 to the unit, and the other of which provides for connection of an accessory cable 14 to the unit. For performing a test and presenting test result data, unit 12 device comprises a keypad 16 and a display 18.

One of the accessories of cable 14 is an AMP CLAMP like the one described earlier. It comprises an electrical coil 20 that is shown clamped around the exterior of one or more wires or cables 22 that connect the positive terminal 24P of a bank of one or more D.C. storage batteries 24 and the positive output terminal 26P of an alternator that is operated by an internal combustion engine 28 that forms the powerplant that propels the vehicle.

Battery test cable 13 comprises positive and negative alligator clamps for connection to positive and negative terminals respectively, in this instance to positive alternator terminal 26P and to the negative alternator terminal 26N.

A load bank 30 is connected between the positive battery bank terminal 24P and a negative battery bank terminal 24N by clamping respective cables 32, 34 that come from the load bank to the respective battery terminals. Load bank 30 comprises a selectable resistance load for drawing a selectable magnitude of electric current that can be large enough to load the alternator at least to, and potentially beyond, its rated current capacity. The range shown in FIG. 1 is representative for a large truck.

In accordance with one aspect of the invention, the selection of a resistance load for load bank 30 is made by wireless communication between unit 12 and the load bank, the wireless communication being schematically portrayed by the reference numeral 36. Unit 12 includes a radio transmitter 38 embodied either externally of the unit casing, as shown, or internally of the casing. Load bank 30 comprises a radio receiver 40 that is capable of receiving radio signals sent from transmitter 38. An advantage of radio communication over some other forms of wireless communication is that it is unnecessary for the target of a transmitter be in the line of sight of the transmitter.

For making the load selectable, load bank 30 has different electrical loads that can be switched in and out between cables 32, 34 to select any desired one of multiple possible loads. The selection of which load or loads is or are to be switched in is based on data transmitted from transmitter 38 to receiver 40. A technician seated in the occupant compartment of the vehicle can remotely select a particular load by an appropriate entry on keypad 16. The entry is processed by the platform to cause an appropriate radio signal to be transmitted from transmitter 38. The particular signal transmitted is effective to operate a particular switch or combination of switches in load bank 30.

Figure 2A:
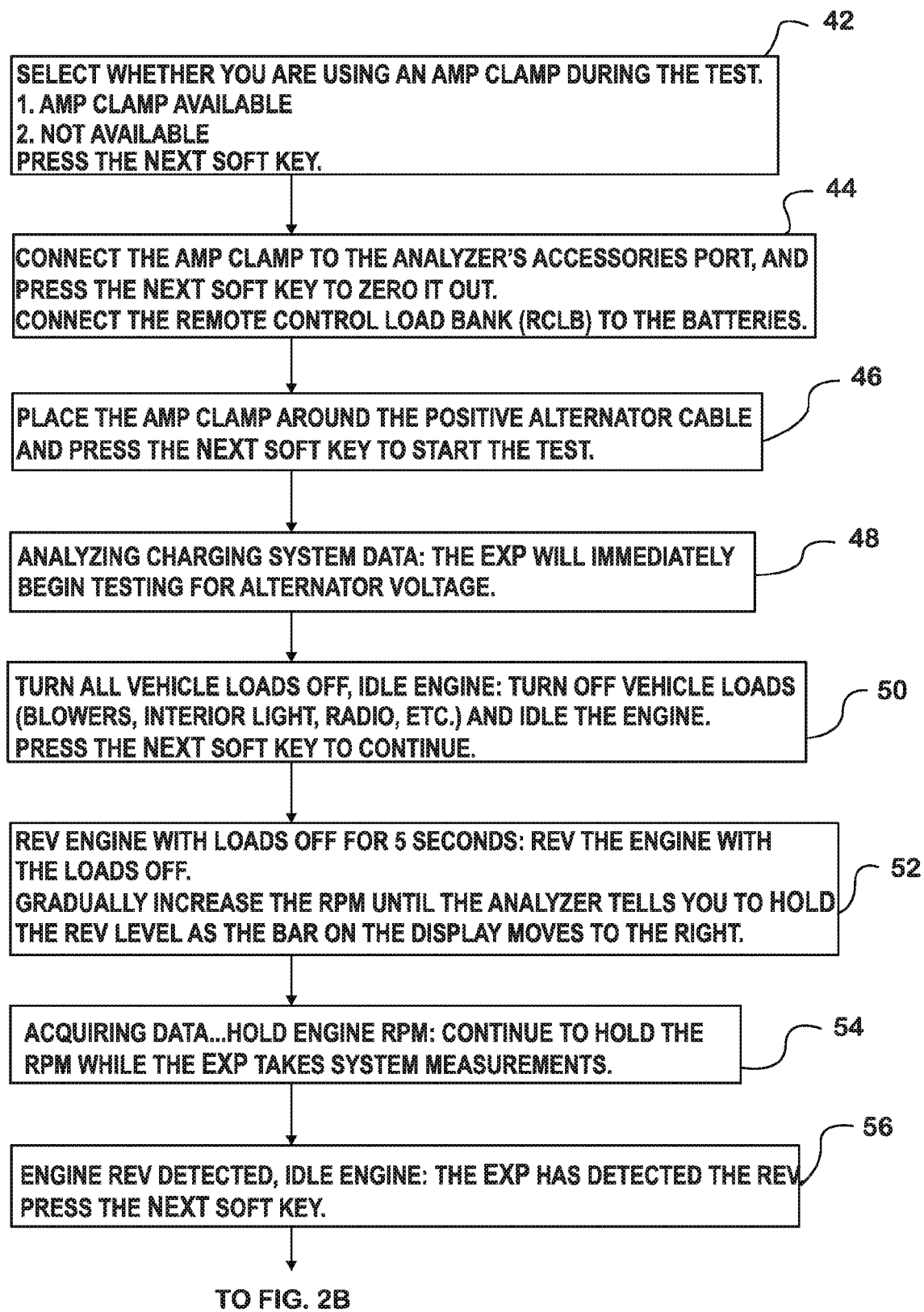
FIG. 2A is a portion of a diagram presenting steps of one diagnostic test method.
Figure 2B:
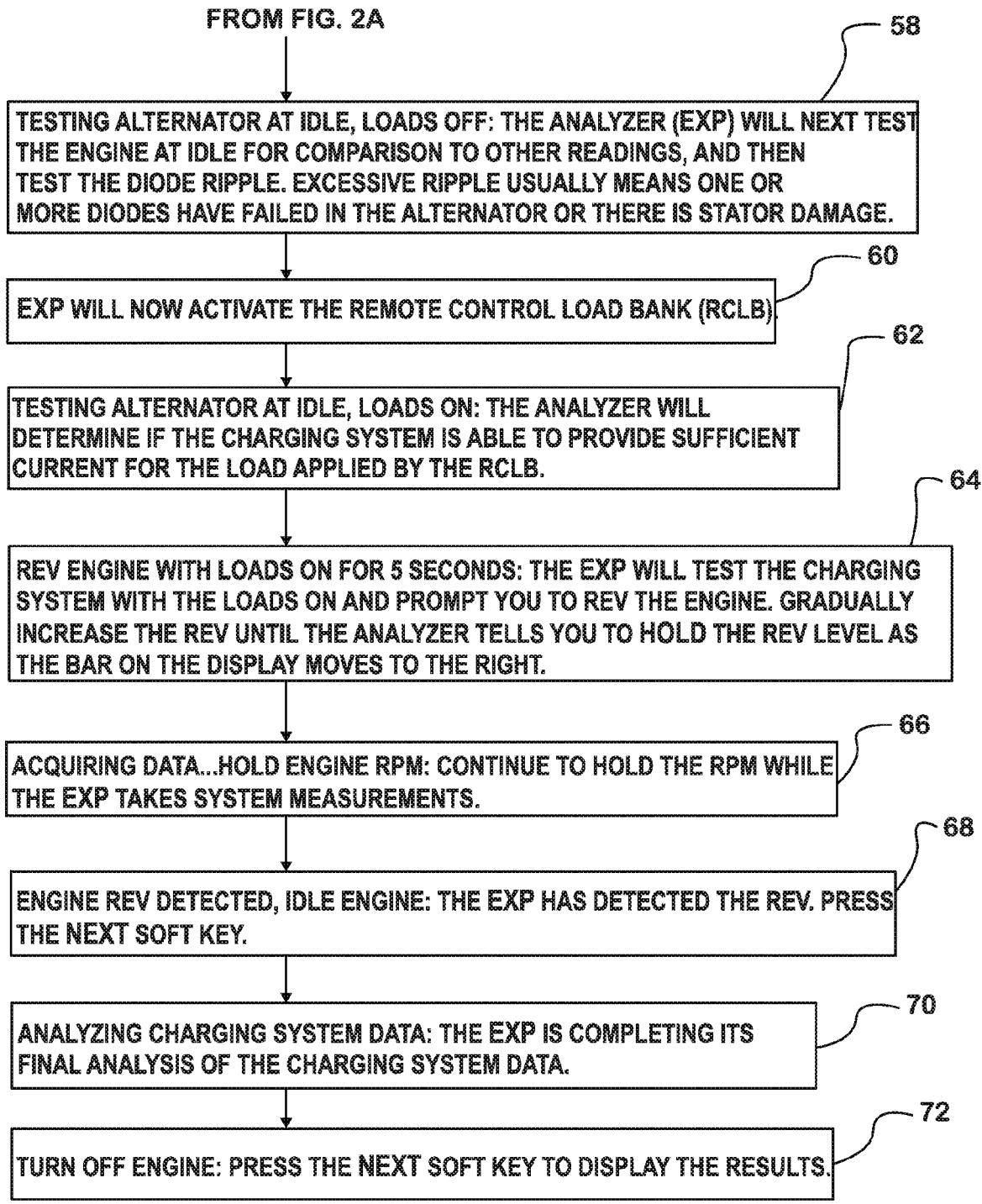
FIG. 2B is another portion of the diagram presenting additional steps of the method.

FIGS. 2A and 2B illustrate steps of a representative charging circuit test. Upon commencement of the test, the test protocol requires that the technician perform certain procedures preparatory to actual test loading of the alternator including selecting the use of AMP CLAMP 20 as indicated by step 42. Depressing the NEXT soft key on the keypad leads to the next preparatory step 44.

With AMP CLAMP 20 connected to the appropriate port of unit 12, pressing the NEXT soft key zeros a current reading that is presented on display 18 to show that the AMP CLAMP is reading no magnetic flux passing through it. Load Bank 30 is connected to the battery bank.

Step 46 calls for placing AMP CLAMP 20 around cable 22. Depressing the NEXT soft key starts the actual charging system test. Load bank 30 is not loading the system at this time.

The handheld unit begins to read the alternator voltage provided by cable 13 (Step 48).

At step 50, engine 28 is allowed to idle while remaining disengaged from the vehicle drivetrain. All electrical equipment in the vehicle is disconnected from the battery bank and alternator except equipment required for operating engine 28 like the engine control system, fuel injector drivers, etc. The NEXT soft key is then depressed to continue to step 52.

The technician is instructed to accelerate (i.e., rev) engine 28 by gradually increasing engine speed until display 18 shows a certain speed. At that point, engine speed is held steady while unit 12 measures the current that alternator 26 is delivering through cable 22. (Step 54) Engine speed is indicated by the frequency of the diode ripple in the alternator output voltage. The alternator output voltage is also measured.

After the measurements have been taken, display 18 instructs the technician to allow the engine to return to idle. (Step 56).

When display 18 shows that the engine has returned to idle, the NEXT soft key is depressed to continue to step 58.

Step 58 takes data at engine idle and compares that data with data obtained when the engine was accelerated.

At step 60, the technician wirelessly signals load bank 30 to begin loading the electrical system.

Steps 62, 64, and 66 collectively comprise operating the load bank to different loads, and for each load, accelerating the engine to a certain speed and taking measurements. Step 68 finally instructs the technician to idle the engine after the measurements have been taken.

Step 70 comprises the platform analyzing the collected data. The engine can then be turned off. When the NEXT soft key is pressed, the results are displayed (Step 72).

It is to be understood that the particular test described with reference to FIGS. 2A and 2B is merely representative of various types of tests that are performed on circuits where a load bank is connected across the D.C. power supply of the vehicle electrical system, either the alternator or the battery bank, and the ability to wirelessly set the resistance of the load can provide improved convenience for the test technician and improved efficiency for the test.

While a presently preferred embodiment of the invention has been illustrated and described, it should be appreciated that principles of the invention apply to all embodiments falling within the scope of the following claims.

What is claimed is:

1. In a motor vehicle comprising a powerplant in which fuel is combusted to generate heat for operating the powerplant to enable the powerplant to propel the vehicle and to operate electrical equipment in an electrical system of the vehicle that includes an alternator operated by the powerplant for generating electricity to maintain a desired state-of-charge of a D.C. battery bank comprising one or more D.C. batteries, a method for testing the electrical system which comprises the steps of:

connecting a test load bank to positive and negative terminals of one of the battery bank and the alternator;
   connecting a service tool for performing the test to the electrical system;
   disconnecting all electrical equipment from the battery bank except equipment required for operating the powerplant and maintaining battery bank state-of-charge;
   operating the powerplant;
   operating the service tool to perform the test;
   and during the test, wirelessly operating the test load bank to change the load that the battery bank imposes on the one of the battery bank and the alternator.

2. A method as set forth in claim 1 wherein the step of connecting a service tool for performing the test to the electrical system comprises placing an electrical coil that is connected to the service tool around one or more cables that connect a positive output terminal of the alternator and a positive terminal of the battery bank.

3. A method as set forth in claim 2 wherein the step of operating the service tool to perform the test comprises measuring electric current flow from the alternator to the battery bank for each of multiple different loads to which the load bank is wirelessly operated.

4. A method as set forth in claim 1 wherein the step of wirelessly operating the test load bank to change the load that the test load bank imposes on one of the battery bank and the alternator comprises transmitting a radio signal from a radio transmitter to a radio receiver in the load bank to set a condition of one or more switches in the load bank.

\* \* \* \* \*